United States Patent
Elsayad et al.

(10) Patent No.: US 10,284,092 B1
(45) Date of Patent: May 7, 2019

(54) POWER ELECTRONIC BUILDING BLOCK USING SERIES-STACKED GALLIUM-NITRIDE HEMTS

(71) Applicants: Noureldeen Elsayad, Miami, FL (US); Mehdi Shojaie, Miami, FL (US); Osama Mohammed, Miami, FL (US)

(72) Inventors: Noureldeen Elsayad, Miami, FL (US); Mehdi Shojaie, Miami, FL (US); Osama Mohammed, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 15/979,892

(22) Filed: May 15, 2018

(51) Int. Cl.
| | | |
|---|---|---|
| *H02M 3/158* | (2006.01) | |
| *H01L 29/20* | (2006.01) | |
| *H02M 7/219* | (2006.01) | |
| *H02M 7/5387* | (2007.01) | |
| *H01L 27/06* | (2006.01) | |

(52) U.S. Cl.
CPC ...... *H02M 3/1582* (2013.01); *H01L 27/0605* (2013.01); *H01L 29/2003* (2013.01); *H02M 7/219* (2013.01); *H02M 7/53875* (2013.01)

(58) Field of Classification Search
CPC .............. H02M 3/1582; H02M 7/219; H02M 7/53875; H01L 27/0605; H01L 29/2003
See application file for complete search history.

(56) References Cited

U.S. PATENT DOCUMENTS

| | | | | |
|---|---|---|---|---|
| 7,071,660 | B2* | 7/2006 | Xu | H02M 3/156 323/266 |
| 7,869,226 | B2* | 1/2011 | Sirio | H02M 3/1588 363/132 |
| 9,729,078 | B2* | 8/2017 | Achleitner | H02M 7/219 |
| 2007/0296383 | A1* | 12/2007 | Xu | H02M 1/14 323/282 |
| 2012/0287690 | A1* | 11/2012 | Paatero | H02M 7/487 363/134 |
| 2014/0098587 | A1* | 4/2014 | Yatsu | H02M 7/483 363/131 |
| 2014/0376287 | A1* | 12/2014 | Narimani | H02M 3/07 363/60 |
| 2015/0016169 | A1* | 1/2015 | Honea | H02M 7/5387 363/132 |
| 2015/0280608 | A1* | 10/2015 | Yoscovich | H02M 7/483 363/131 |

* cited by examiner

*Primary Examiner* — Emily P Pham
(74) *Attorney, Agent, or Firm* — Saliwanchik, Lloyd & Eisenschenk

(57) ABSTRACT

A power converter can include: a first power terminal and a second power terminal; a first upper series-stacked high electron mobility transistor (HEMT) module connected to the first power terminal and a first intermediate terminal; a first lower series-stacked HEMT module connected to the second power terminal and the first intermediate terminal; a first inductor connected to the first intermediate terminal and a third power terminal; and a fourth power terminal connected to the second power terminal. Each of the first upper and first lower series-stacked HEMT modules can have a first plurality of HEMTs and a first series-switch-driver connected to each gate of the first plurality of HEMTs.

18 Claims, 13 Drawing Sheets

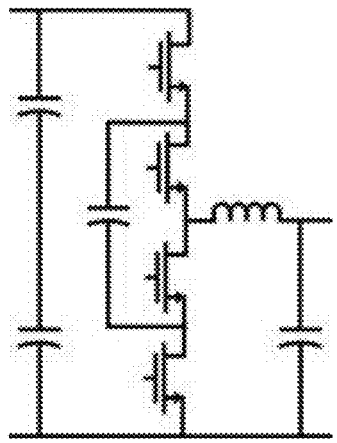
Figure 1(a)
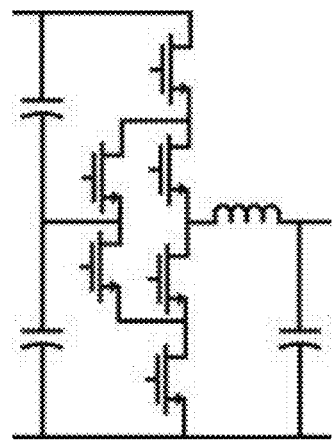
Figure 1(b)
 GaN HEMT symbol
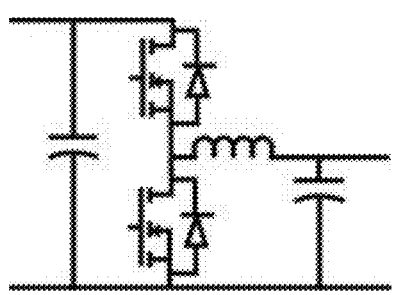
Figure 2(a)
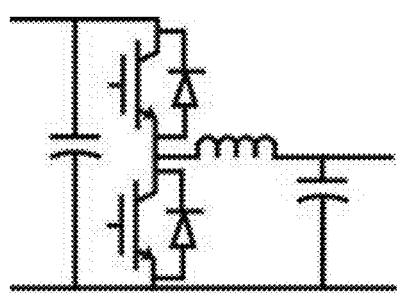
Figure 2(b)
 Si/SiC MOSFET symbol
 Si/SiC IGBT symbol
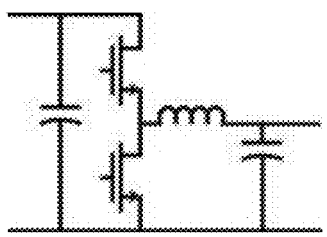
Figure 3
 GaN HEMT symbol

620

POWER ELECTRONIC BUILDING BLOCK USING SERIES-STACKED GALLIUM-NITRIDE HEMTS

BACKGROUND

The Power Electronic Building Block (PEBB) is a generic power electronic converter circuit that can be configured in different ways to synthesize popular power electronic architectures (DC-DC, DC-AC, AC-DC, and AC-AC converters). This can reduce the number of spare parts needed onboard a ship, plane, or other such vessel. The PEBB can also reduce the manufacturing cost of power electronic systems because the mass production of one generic power electronic architecture is more economical than producing application-specific power electronic architectures. Many different possible architectures for the PEBB have been proposed, but all of them are either implemented using silicon (Si), silicon carbide (SiC) Metal Oxide Semiconductor Field Effect Transistors (MOSFETs) or Insulated Gate Bipolar Junction Transistors (IGBTs), which suffer from high conduction and switching losses.

A PEBB has been built with gallium nitride (GaN) High Electron Mobility Transistors (HEMTs) to reduce the conduction and switching losses of the transistors because the GaN HEMTs have lower on-resistance (Ron) and less device total charge. The major problem with GaN HEMTs is that their breakdown voltage is relatively lower compared to Si and SiC MOSFETs or IGBTs, which limits the utilization of GaN HEMTs in low-voltage applications. Multilevel half-bridge configurations enable the utilization of GaN HEMTs in high-voltage applications. These topologies can possibly be based on a flying capacitor (FC) leg or a neutral point clamped (NPC) leg. The major problem of multilevel configurations is that they require a complex control scheme and more switches (as in the NPC) or more high voltage capacitors (as in the FC).

BRIEF SUMMARY

Embodiments of the subject invention solve the above-mentioned problems by providing novel and advantageous power electronic building blocks (PEBB) that comprise series-stacked gallium-nitride (GaN) High Electron Mobility Transistors (HEMTs) and Series-Switch-Drivers (SSDs) to balance out the voltage sharing between the series-stacked GaN HEMTs during transitions (turn-on and turn-off) and during steady state, thereby providing GaN-based PEBBs that work at high voltages.

In an embodiment, a power converter can comprise: a first power terminal and a second power terminal; a first upper series-stacked high electron mobility transistor (HEMT) module connected to the first power terminal and a first intermediate terminal; a first lower series-stacked HEMT module connected to the second power terminal and the first intermediate terminal; a first inductor connected to the first intermediate terminal and a third power terminal; and a fourth power terminal connected to the second power terminal, each of the first upper and first lower series-stacked HEMT modules having a first plurality of HEMTs and a first series-switch-driver connected to each gate of the first plurality of HEMTs.

In another embodiment, a power converter can comprise: a first power terminal and a second power terminal; a first upper series-stacked high electron mobility transistor (HEMT) module connected to the first power terminal and a first intermediate terminal; a first lower series-stacked HEMT module connected to the second power terminal and the first intermediate terminal; a first inductor connected to the first intermediate terminal and a third power terminal; a fourth power terminal connected to the second power terminal, a first capacitor connected between the first power terminal and the second power terminal; a second capacitor connected between the third power terminal and the fourth power terminal; each of the first upper and first lower series-stacked HEMT modules having a first plurality of HEMTs and a first series-switch-driver connected to each gate of the first plurality of HEMTs, each of the first plurality of HEMTs being a gallium nitride (GaN) HEMT.

In yet another embodiment, a power converter can comprise: a first power terminal and a second power terminal; a first upper series-stacked high electron mobility transistor (HEMT) module connected to the first power terminal and a first intermediate terminal; a first lower series-stacked HEMT module connected to the second power terminal and the first intermediate terminal; a first inductor connected to the first intermediate terminal and a third power terminal; a fourth power terminal connected to the second power terminal; a fifth power terminal and a sixth power terminal; a second upper series-stacked HEMT module connected to the fifth power terminal and a second intermediate terminal; a second lower series-stacked HEMT module connected to the sixth power terminal and the second intermediate terminal; a second inductor connected to the second intermediate terminal and a seventh power terminal; and an eighth power terminal connected to the sixth power terminal, each of the first upper and first lower series-stacked HEMT modules having a first plurality of HEMTs and a first series-switch-driver connected to each gate of the first plurality of HEMTs, each of the second upper and second lower series-stacked HEMT modules having a second plurality of HEMTs and a second series-switch-driver connected to each gate of the second plurality of HEMTs. each of the first upper, first lower, second upper, and second lower series-stacked HEMT modules comprising: a first HEMT; a second HEMT, a first drain of the first HEMT being connected to a second source of the second HEMT; a first gate input terminal coupled to a first gate of the first HEMT; a second gate input terminal coupled to a second gate of the second HEMT; a first driver connected between the first gate input terminal and a first gate intermediate terminal; a first FB connected between the first gate intermediate terminal and the first gate of the first HEMT; a second driver connected between the second gate input terminal and a second gate intermediate terminal; a first gate capacitor connected between the first gate input terminal and the second gate input terminal; and a second gate capacitor connected between the second gate intermediate terminal and a second drain of the second HEMT, and the second driver comprising a second FB connected between the second gate input terminal and a second gate intermediate terminal.

BRIEF DESCRIPTION OF DRAWINGS

FIG. 1(a) shows a multilevel half-bridge-based PEBB having a flying capacitor leg.

FIG. 1(b) shows a multilevel half-bridge-based PEBB having a neutral point clamped leg.

FIG. 2(a) shows a two level half-bridge-based PEEB using Si/SiC MOSFETs.

FIG. 2(b) shows a two level half-bridge-based PEEB using Si/SiC IGBTs.

FIG. 3 shows a two level half-bridge-based PEEG using GaN HEMTs.

DETAILED DESCRIPTION

Embodiments of the subject invention provide novel and advantageous power electronic building blocks (PEBB) that comprise series-stacked gallium-nitride (GaN) High Electron Mobility Transistors (HEMTs) and Series-Switch-Drivers (SSDs) to balance out the voltage sharing between the series-stacked GaN HEMTs during transitions (turn-on and turn-off) and during steady state, thereby providing GaN-based PEBBs that work at high voltages.

In embodiments of the subject invention, a two-level half-bridge-based PEBB is built with series-stacked GaN HEMTs. The SSD is utilized to balance out the voltage sharing between the series-stacked GaN HEMTs during transitions (turn-on and turn-off) and during steady state. The GaN-based PEBB of embodiments of the subject invention has the capability of working at high voltages with high efficiency and requires a simple control scheme.

FIGS. 1(a)-5(b) show a variety of PEBBs having a FC leg or NPC leg, where each transistor of the PEBB is implemented by a Si/SiC MOSFET, a Si/SiC IBGT, or a GaN HEMT. However, these PEBBs require complex control for MOSFETSs, IBGTs, or GaN HEMTs.

Figure 4A:
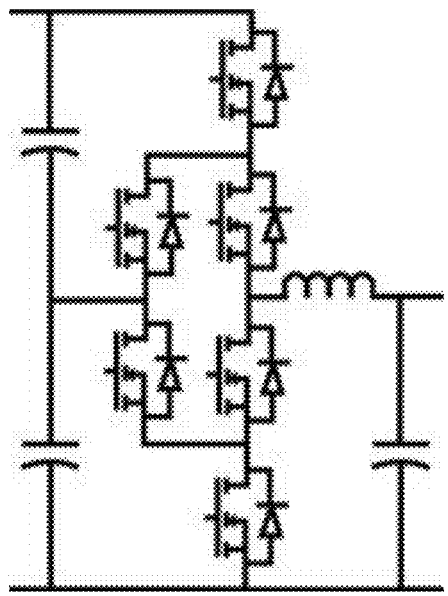
FIG. 4(a) shows a NPC-based PEBB using Si/SiC MOSFETs.
Figure 4B:
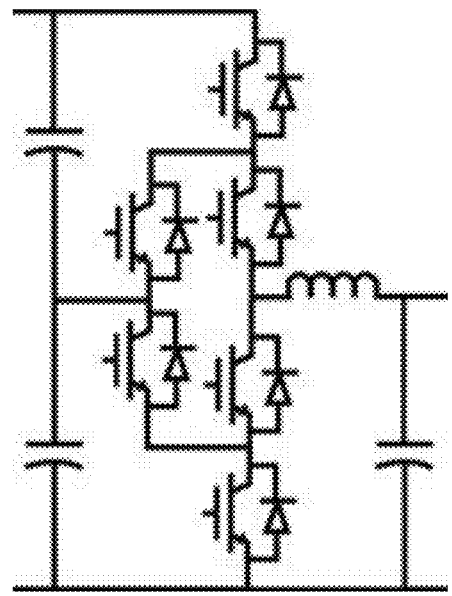
FIG. 4(b) shows a NPC-based PEBB using Si/SiC IGBTs.
Figure 5A:
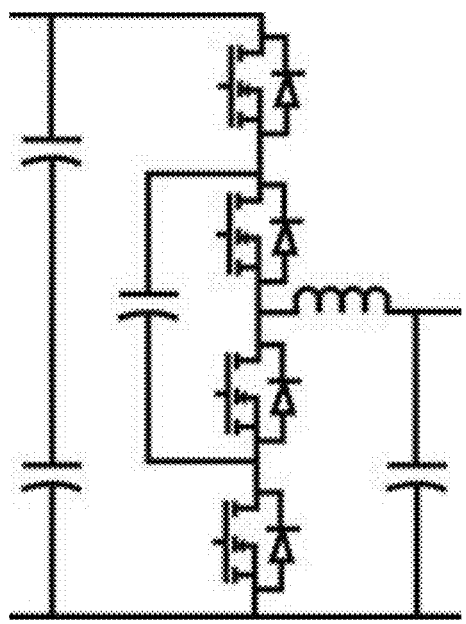
FIG. 5(a) shows a FC-based PEBB using Si/SiC MOSFETs.
Figure 5B:
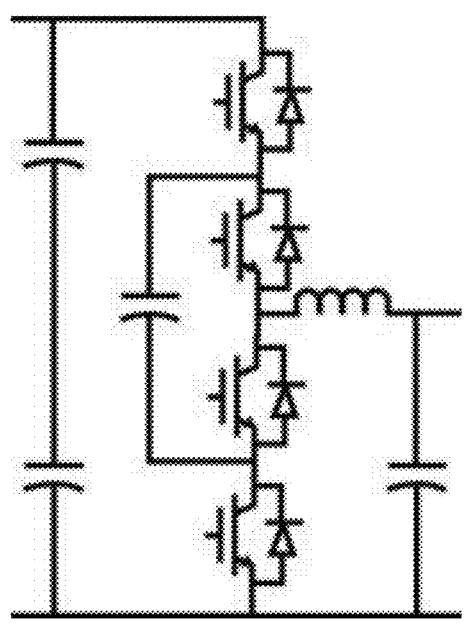
FIG. 5(b) shows a FC-based PEBB using Si/SiC IGBTs.
Figure 6:
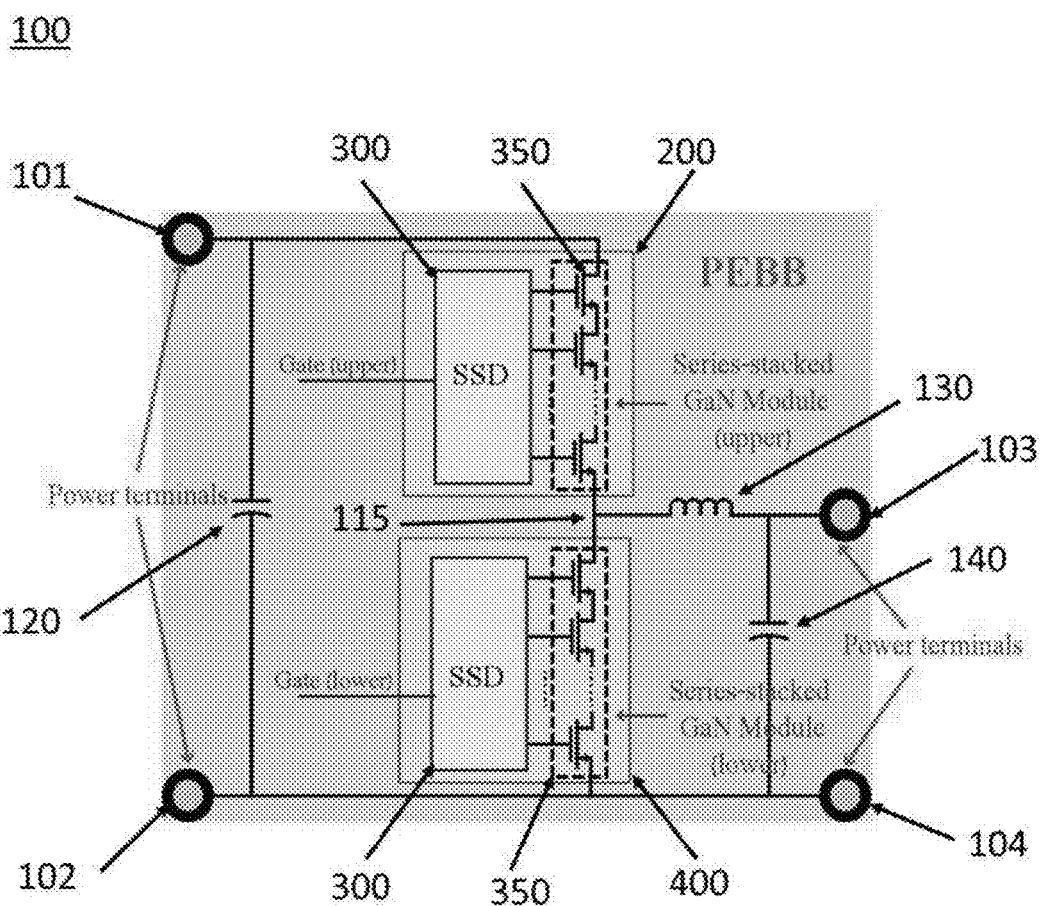
FIG. 6 shows a PEBB using series-stacked HEMT modules according to an embodiment of the subject invention.

FIG. 6 shows a PEBB using series-stacked HEMT modules according to an embodiment of the subject invention. Referring to FIG. 6, a PEBB 100 as a generic power electronic converter circuit comprises a first upper series-stacked HEMT module 200 (e.g., upper series-stacked GaN module) and a first lower series-stacked HEMT module 400 that are connected to each other in series through a first intermediate terminal 115 between a first power terminal 101 and a second power terminal 102. That is, the first upper series-stacked HEMT module 200 is connected between the first power terminal 101 and the first intermediate terminal 115, and the first lower series-stacked HEMT module 400 is connected between the first intermediate terminal 115 and the second power terminal 102.

The PEBB 100 further comprises a first inductor 130 between the first intermediate terminal 115 and a third power terminal 103. In addition, the PEBB 100 comprises a first capacitor 120 connected between the first power terminal 101 and the second power terminal 102, and a second capacitor 140 connected between the third power terminal 103 and a fourth power terminal 104, where the fourth power terminal 104 is connected to the second power terminal 102 and the first lower series-stacked HEMT module 400. Each of the first upper 200 and first lower 400 series-stacked HEMT modules comprises a first plurality of HEMTs 350 and a first series-switch-driver (SSD) 300, where each gate of the first plurality of HEMTs 350 is connected to the first SSD 300. Each of the first plurality of HEMTs 350 is made of GaN HEMT.

Figure 7:
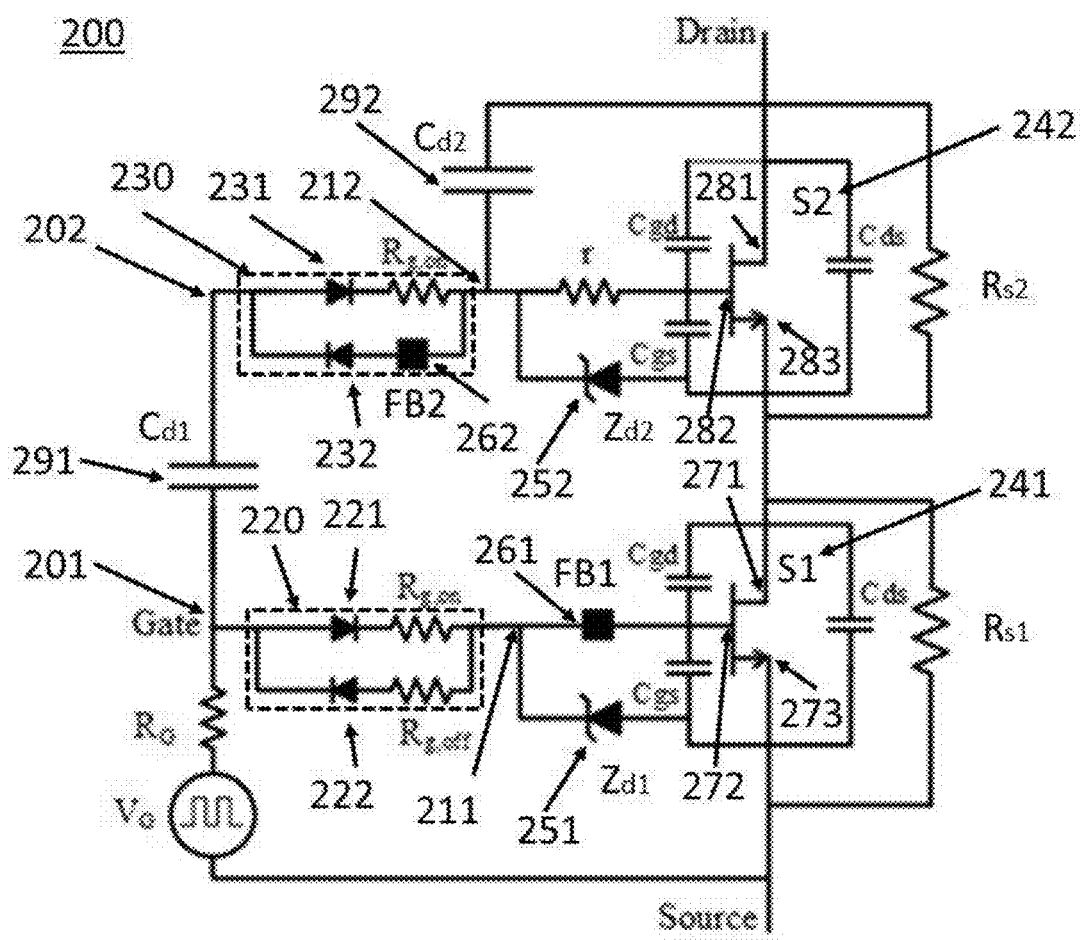
FIG. 7 shows a HEMT module including two HEMTs and the SSD according to an embodiment of the subject invention.

FIG. 7 shows a HEMT module including two HEMTs and the SSD according to an embodiment of the subject invention. The first upper series-stacked HEMT module 200 and the first lower series-stacked HEMT module 400 have the same structure. Referring to FIG. 7, the first upper series-stacked HEMT module 200 comprises a first HEMT 241 including a first drain 271, a first gate 272, and a first source 273, and a second HEMT 242 including a second drain 281, a second gate 282, and a second source 283, where the first drain 271 of the first HEMT 241 is connected to the second source 283 of the second HEMT 242.

The first upper series-stacked HEMT module 200 comprises a first driver 220 connected between a first gate input terminal 201 and a first gate intermediate terminal 211, and a second driver 230 connected between a second gate input terminal 202 and a second gate intermediate terminal 212, where the first gate intermediate terminal 211 is coupled to the first gate 272 and the second gate intermediate terminal 212 is coupled to the second gate 282.

The first upper series-stacked HEMT module 200 comprises a first gate capacitor 291 connected between the first gate input terminal 201 and the second gate input terminal 202, and a second gate capacitor 292 connected between the second gate intermediate terminal 212 and the second drain 281 of the second HEMT 242. In addition, the first upper series-stacked HEMT module 200 comprises a first Zener diode 251 connected between the first gate intermediate terminal 211 and the first source 273 of the first HEMT 241, and a second Zener diose 252 connected between the second gate intermediate terminal 212 and the second source 283 of the second HEMT 242.

The first upper series-stacked HEMT module 200 further comprises a first Ferrite Bead (FB) 261 connected between the first gate intermediate terminal 211 and the first gate 272 of the first HEMT 241, and a second FB 262 connected between the second gate input terminal 202 and the second gate intermediate terminal 212. Each of the first FB 261 and the second FB 262 is a component with passive elements such as a resistor (R), an inductor (L), and a capacitor (C) that filters high-frequency oscillations in the gate-source voltage of the transistors during the switching transitions.

The gate driving schemes of the first HEMT 241 and the second HEMT 242 are different because the second HEMT 242 is more susceptible to ringing. The second HEMT 242 needs a small resistor at the second gate 282, so the second FB 262 is placed in the turn-off loop of it because this device could suffer from false turn-on due to the ringing in the turn-off period, while the first HEMT 241 needs a lower impedance FB for both turn-on and turn-off transition periods. Thus, the first FB 261 and the second 262 are differently connected to the first gate 272 and the second gate 282, respectively.

The first driver 220 comprises a first driver first diode 221 and a first driver second diode 222. The first driver first diode 221 with a resistor $R_{g,on}$ is connected between the first gate input terminal 201 and the first gate intermediate terminal 211 such that a diode forward current flows from the first gate input terminal 201 to the first gate intermediate terminal 211. The first driver second diode 222 with a resistor $R_{g,off}$ is connected between the first gate input terminal 201 and the first gate intermediate terminal 211 such that a diode forward current flows from the first gate intermediate terminal 211 to the first gate input terminal 201.

The second driver 230 comprises a second driver first diode 231 and a second driver second diode 232. The second driver first diode 231 with a resistor $R_{g,on}$ is connected between the second gate input terminal 202 and the second gate intermediate terminal 212 such that a diode forward current flows from the second gate input terminal 202 to the second gate intermediate terminal 212. The second driver second diode 232 with the second FB 262 is connected between the second gate input terminal 202 and the second gate intermediate terminal 212 such that a diode forward current flows from the second gate intermediate terminal 212 to the second gate input terminal 202.

Each of the first HEMT 241 and the second HEMT 242 has parasitic capacitances including a drain-source parasitic capacitance $C_{ds}$, a gate-source parasitic capacitance $C_{gs}$, and a gate-drain parasitic capacitance $C_{gd}$. In addition, the first HEMT 241 and the second HEMT 242 have a first resistance $R_{s1}$ and a second resistance $R_{s2}$, respectively.

The first upper series-stacked HEMT module 200 can comprise a gate signal $V_G$ connected to the first gate input terminal 201 through an input gate resistor $R_G$.

Figure 8:
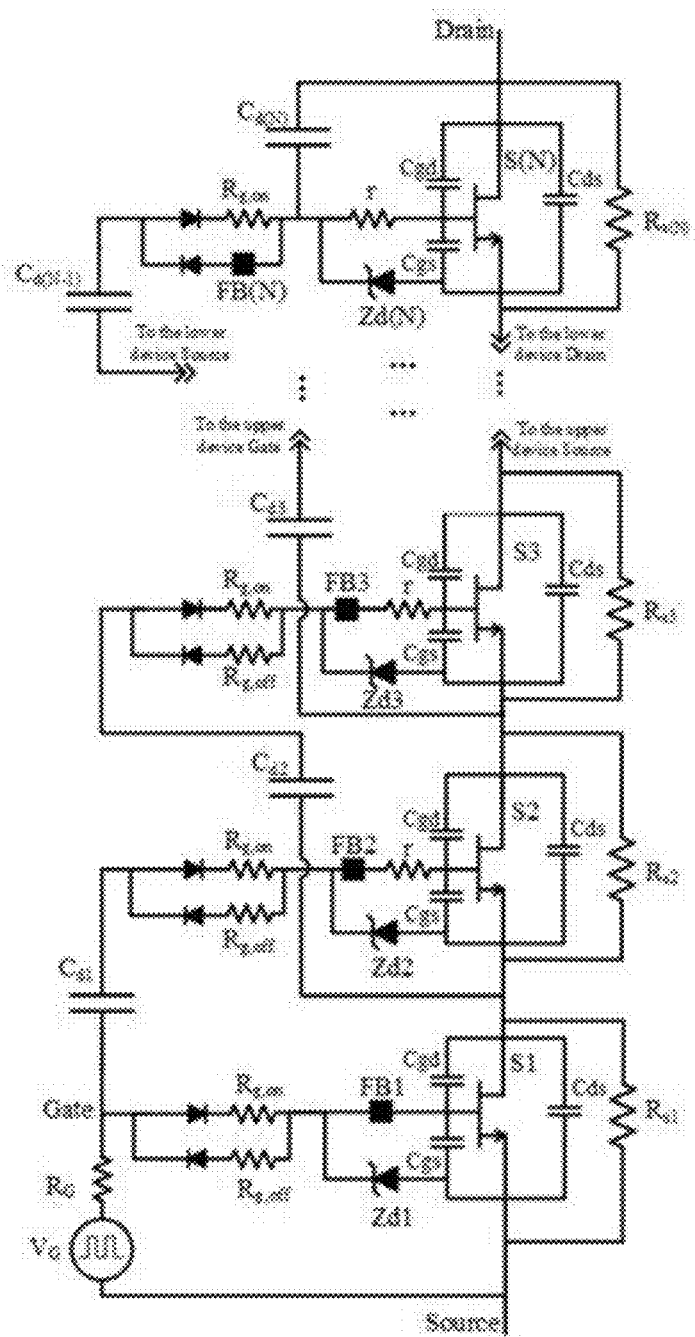
FIG. 8 shows a HEMT module including more than two HEMTs and the SSD according to an embodiment of the subject invention.

FIG. 8 shows an HEMT module including more than two HEMTs and the SSD according to an embodiment of the subject invention. Referring to FIGS. 7 and 8, the first upper series-stacked HEMT module 200 can comprise first to nth HEMTs (i.e., S1, S2, S3, . . . , S(N)) connected to each other in series. The configuration of the first HEMT S1 of FIG. 8 is similar to the configuration of the first HEMT 241 of FIG. 7, the configuration of the nth HEMT S(N) (i.e., last HEMT) is similar to the configuration of the second HEMT 242, and the repetitive configuration of the kth HEMT (i.e., from second HEMT S2 to (n−1)th HEMT S(n−1)) is similar to the configuration of the first HEMT S1 except the gate capacitor. The kth gate capacitor is connected between (k+1)th gate input terminal and kth source, where k is in a range of 2 to (n−1).

Figure 9A:
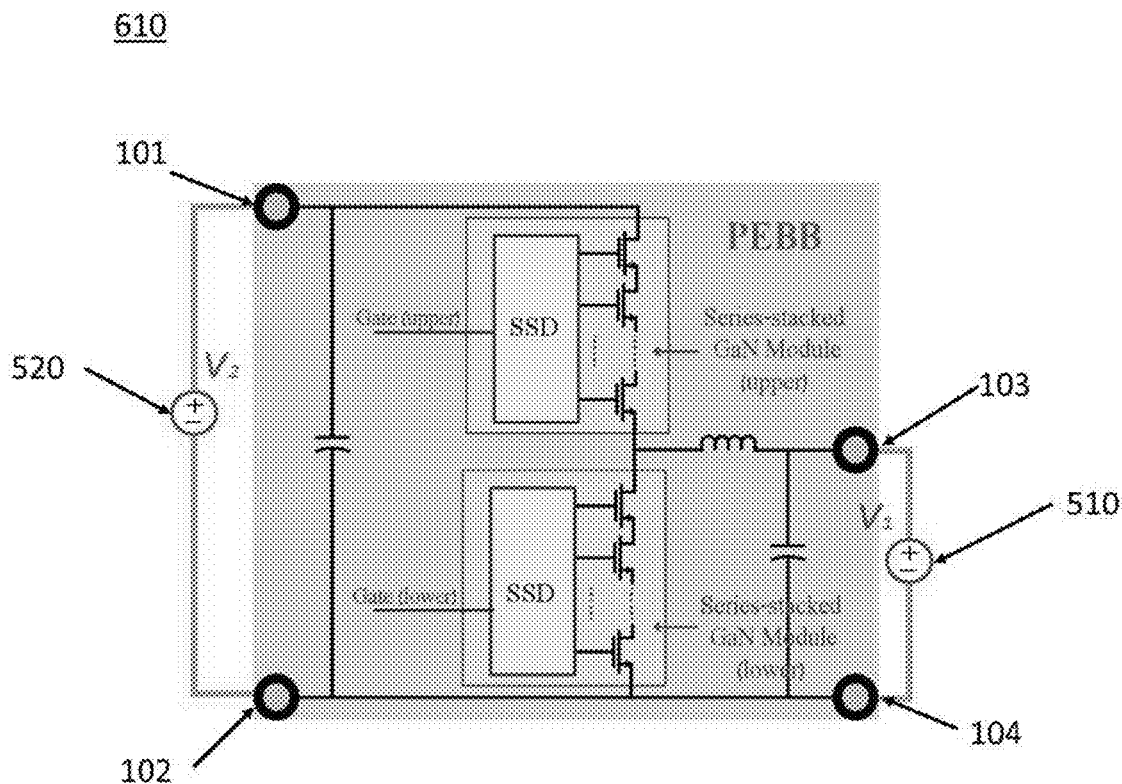
FIG. 9(a) shows a connection diagram of a synchronous buck DC-DC converter according to an embodiment of the subject invention.
Figure 9B:
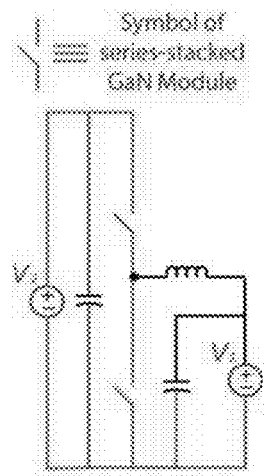
FIG. 9(b) shows a circuit of a synchronous buck DC-DC converter according to an embodiment of the subject invention.

FIGS. 9(a) and 9(b) show a connection diagram and a circuit of a synchronous buck DC-DC converter according to an embodiment of the subject invention, respectively. Referring to FIGS. 9(a) and 9(b), a synchronous buck DC-DC converter 610 using the PEBB 100 of FIG. 6 comprises a first power source 510 connected between the third power terminal 103 and the fourth power terminal 104, and a second power source 520 connected between the first power terminal 101 and the second power terminal 102.

Figure 10A:
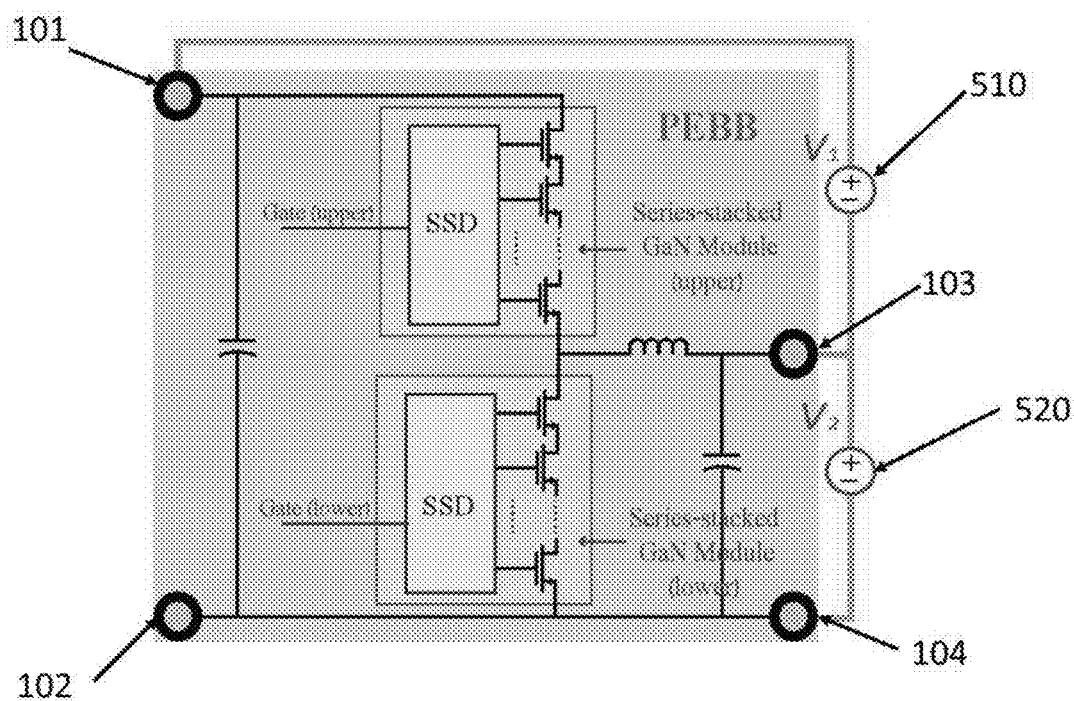
FIG. 10(a) shows a connection diagram of a bidirectional inverting buck-boost DC-DC converter according to an embodiment of the subject invention.
Figure 10B:
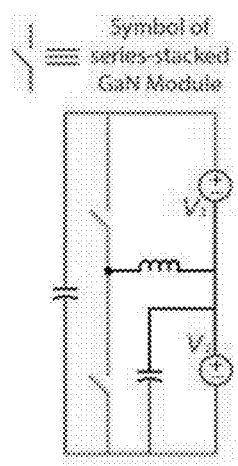
FIG. 10(b) shows a circuit of a bidirectional inverting buck-boost DC-DC converter according to an embodiment of the subject invention.

FIGS. 10(a) and 10(b) show a connection diagram and a circuit of a bidirectional inverting buck-boost DC-DC converter according to an embodiment of the subject invention, respectively. Referring to FIGS. 10(a) and 10(b), a bidirectional inverting buck-boost DC-DC converter 620 using the PEBB 100 of FIG. 6 comprises the first power source 510 connected between the first power terminal 101 and the third power terminal 103, and the second power source 520 connected between the third power terminal 103 and the fourth power terminal 104.

Figure 11A:
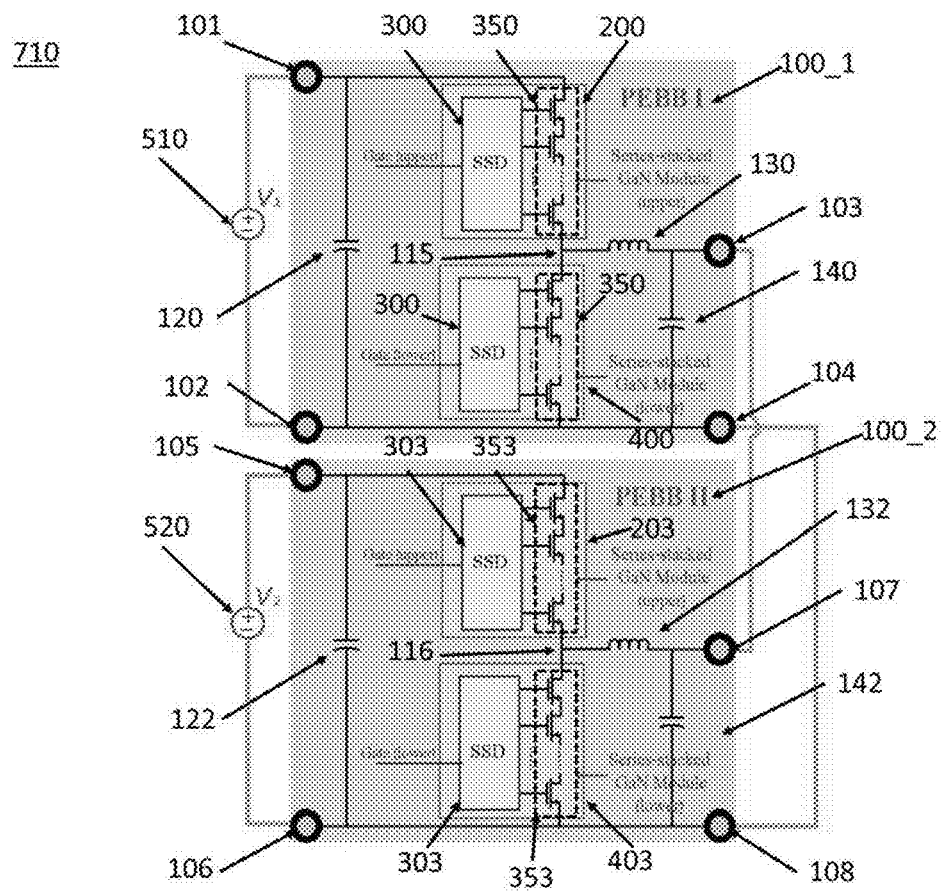
FIG. 11(a) shows a connection diagram of a bidirectional non-inverting buck-boost DC-DC converter according to an embodiment of the subject invention.
Figure 11B:
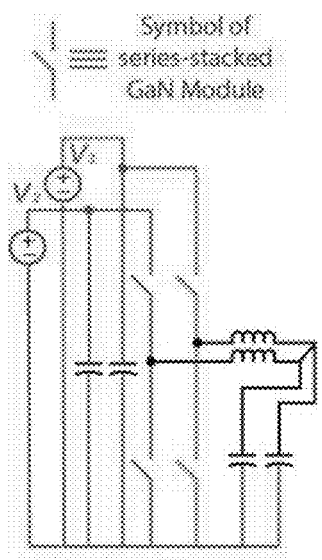
FIG. 11(b) shows a circuit of a bidirectional non-inverting buck-boost DC-DC converter according to an embodiment of the subject invention.

FIGS. 11(a) and 11(b) show a connection diagram and a circuit of a bidirectional non-inverting buck-boost DC-DC converter according to an embodiment of the subject invention, respectively. Referring to FIGS. 11(a) and 11(b), a bidirectional non-inverting buck-boost DC-DC converter 710 comprises the first PEBB 100_1 and the second PEBB 100_2 that are identical to the PEBB 100 of FIG. 6. That is, the second PEBB 100_2 of the bidirectional non-inverting buck-boost DC-DC converter 710 further comprises a second upper series-stacked HEMT module 203 (e.g., upper series-stacked GaN module) and a second lower series-stacked HEMT module 403 that are connected to each other in series through a second intermediate terminal 116 between a fifth power terminal 105 and a sixth power terminal 106. That is, the second upper series-stacked HEMT module 203 is connected between the fifth power terminal 105 and the second intermediate terminal 116, and the second lower series-stacked HEMT module 403 is connected between the second intermediate terminal 116 and the sixth power terminal 106.

The second PEBB 100_2 further comprises a second inductor 132 between the second intermediate terminal 116 and a seventh power terminal 107. In addition, the second PEBB 100_2 comprises a third capacitor 122 connected between the fifth power terminal 105 and the sixth power terminal 106, and a fourth capacitor 142 connected between the seventh power terminal 107 and a eighth power terminal 108, where the eighth power terminal 108 is connected to the sixth power terminal 106 and the second lower series-stacked HEMT module 403. Each of the second upper 203 and second lower 403 series-stacked HEMT modules comprises a second plurality of HEMTs 353 and a second SSD 303, where each gate of the second plurality of HEMTs 353 is connected to the second SSD 303. Each of the second plurality of HEMTs 353 is made of GaN HEMT.

The bidirectional non-inverting buck-boost DC-DC converter 710 comprises the first power source 510 connected between the first power terminal 101 and the second power terminal 102, and the second power source 520 connected between the fifth power terminal 105 and the sixth power terminal 106. In addition, the third power terminal 103 is connected to the seventh power terminal 107, and the fourth power terminal 104 is connected to the eighth power terminal 108.

Figure 12A:
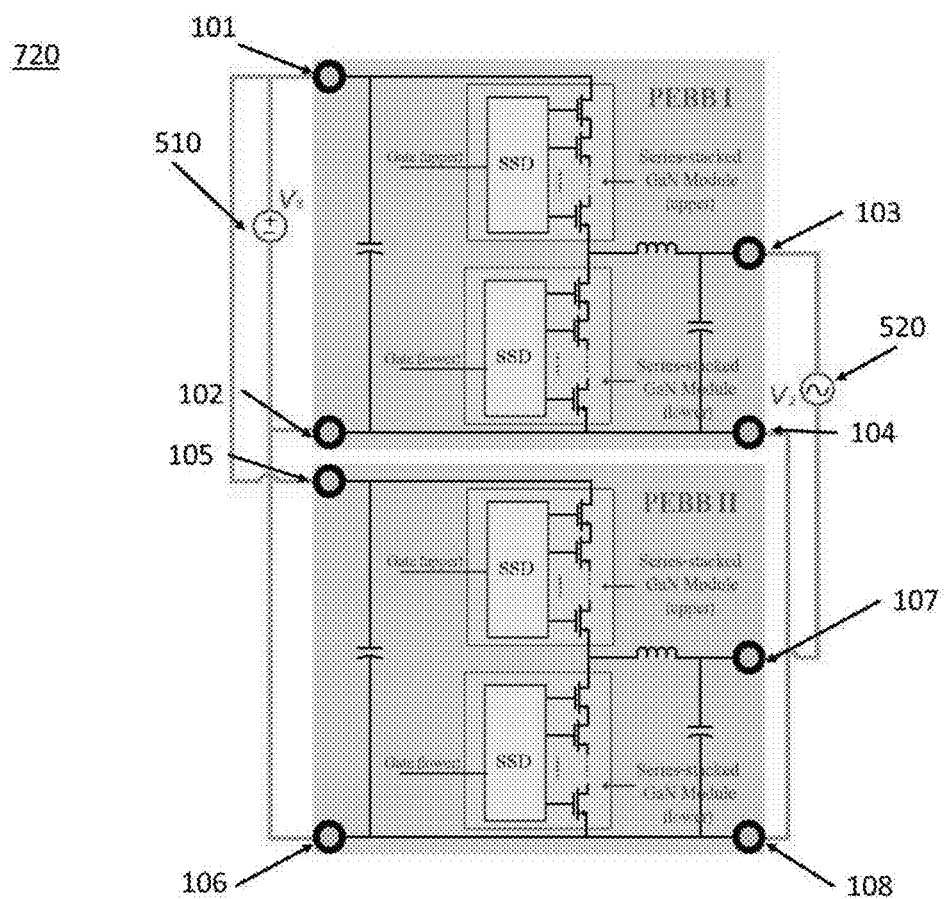
FIG. 12(a) shows a connection diagram of a single-phase buck DC-AC inverter according to an embodiment of the subject invention.
Figure 12B:
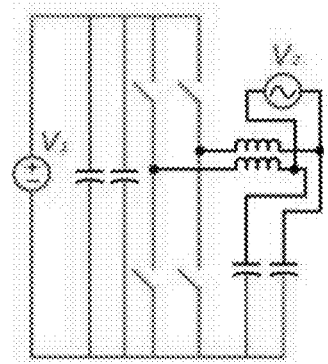
FIG. 12(b) shows a circuit of a single-phase buck DC-AC inverter according to an embodiment of the subject invention.

FIGS. 12(*a*) and 12(*b*) show a connection diagram and a circuit of a single-phase buck DC-AC inverter according to an embodiment of the subject invention, respectively. Referring to FIGS. 12(*a*) and 12(*b*), a single-phase buck DC-AC inverter 720 comprises the first power source 510 connected between the first power terminal 101 and the second power terminal 102, and the second power source 520 connected between the third power terminal 103 and the seventh power terminal 107. In addition, the second power terminal 102 is connected to the sixth power terminal 106, the first power terminal 101 is connected to the fifth power terminal 105, and the fourth power terminal 104 is connected to the eighth power terminal 108.

Figure 13A:
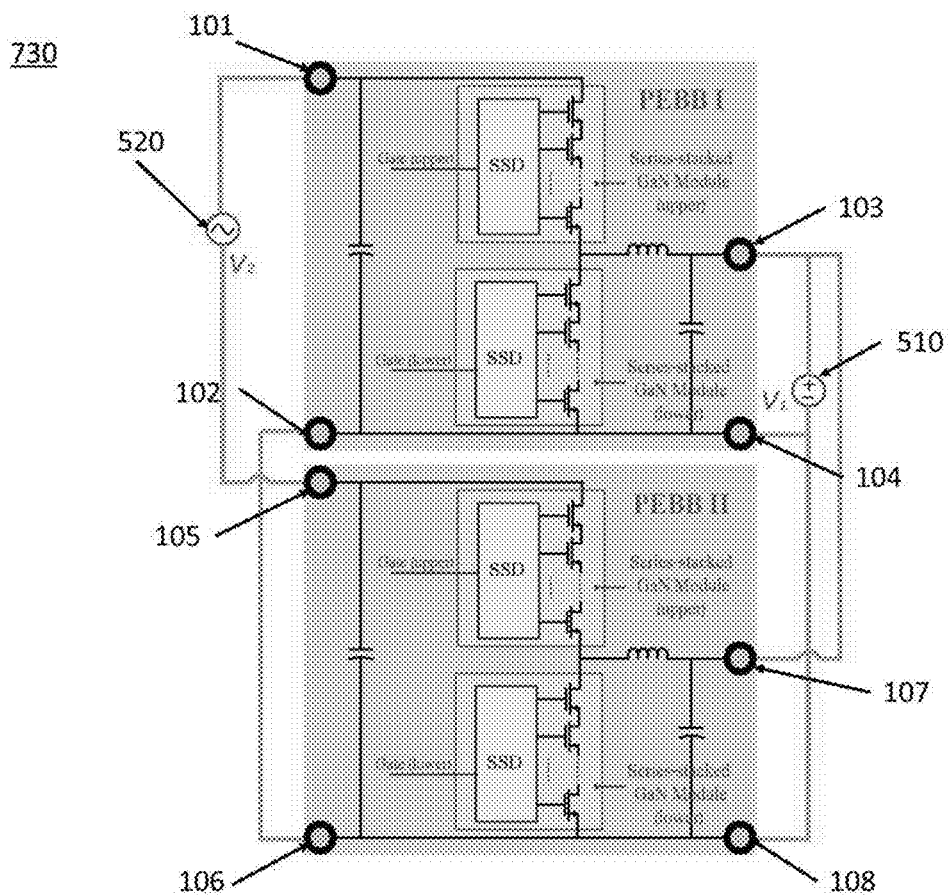
FIG. 13(a) shows a connection diagram of a single-phase boost DC-AC inverter according to an embodiment of the subject invention.
Figure 13B:
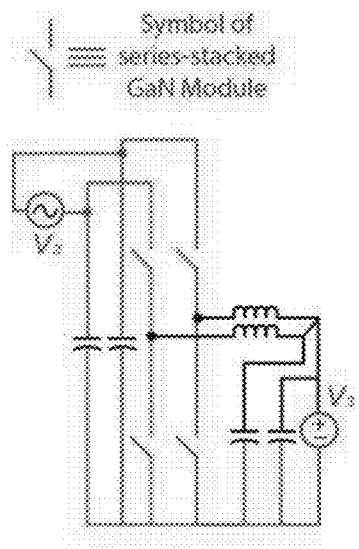
FIG. 13(b) shows a circuit of a single-phase boost DC-AC inverter according to an embodiment of the subject invention.

FIGS. 13(*a*) and 13(*b*) show a connection diagram and a circuit of a single-phase boost DC-AC inverter according to an embodiment of the subject invention, respectively. Referring to FIGS. 13(*a*) and 13(*b*), a single-phase boost DC-AC inverter 730 comprises the first power source 510 connected between the third power terminal 103 and the fourth power terminal 104, and the second power source 520 connected between the first power terminal 101 and the fifth power terminal 105. In addition, the second power terminal 102 is connected to the sixth power terminal 106, the third power terminal 103 is connected to the seventh power terminal 107, and the fourth power terminal 104 is connected to the eighth power terminal 108.

Figure 14A:
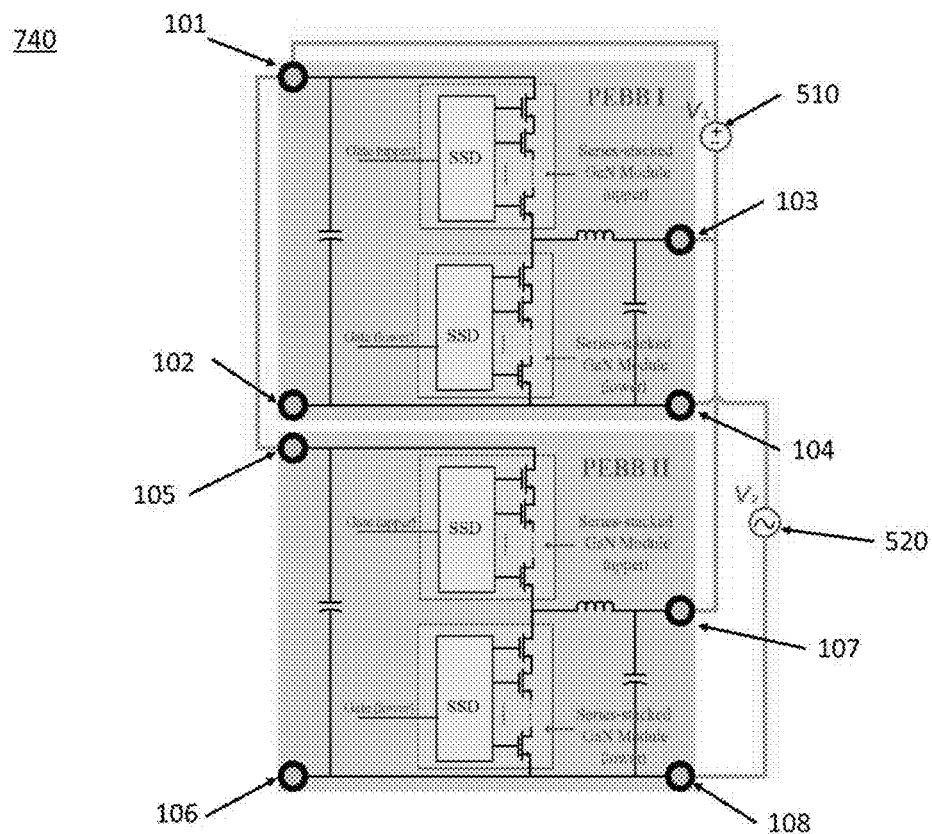
FIG. 14(a) shows a connection diagram of a single-phase buck-boost DC-AC inverter according to an embodiment of the subject invention.
Figure 14B:
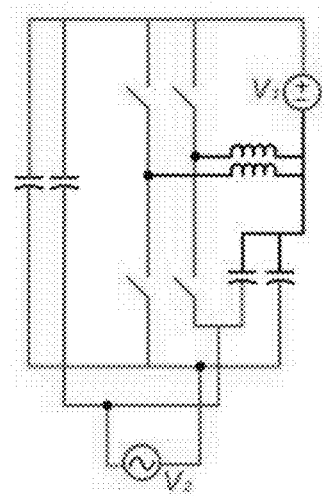
FIG. 14(b) shows a circuit of a single-phase buck-boost DC-AC inverter according to an embodiment of the subject invention.

FIGS. 14(*a*) and 14(*b*) show a connection diagram and a circuit of a single-phase buck-boost DC-AC inverter according to an embodiment of the subject invention, respectively. Referring to FIGS. 14(*a*) and 14(*b*), a single-phase buck-boost DC-AC inverter 740 comprises the first power source 510 connected between the first power terminal 101 and the seventh power terminal 107, and the second power source 520 between the fourth power terminal 104 and the eighth power terminal 108. In addition, the first power terminal 101 is connected to the fifth power terminal 105, and the third power terminal 103 is connected to the seventh power terminal 107.

Figure 15A:
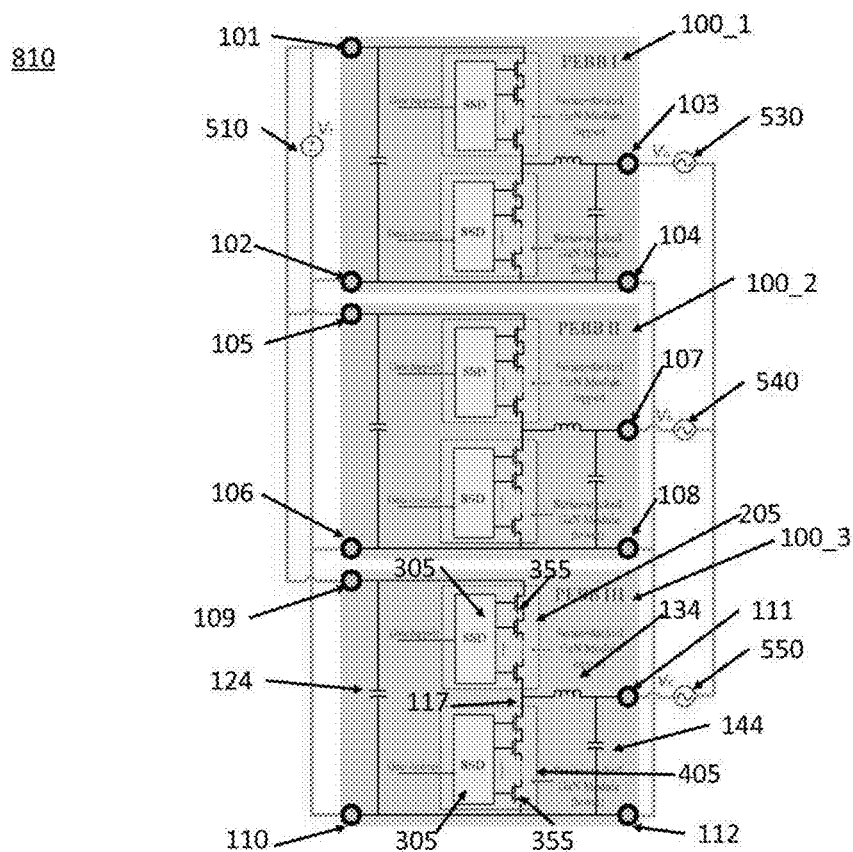
FIG. 15(a) shows a connection diagram of a three-phase buck DC-AC inverter according to an embodiment of the subject invention.
Figure 15B:
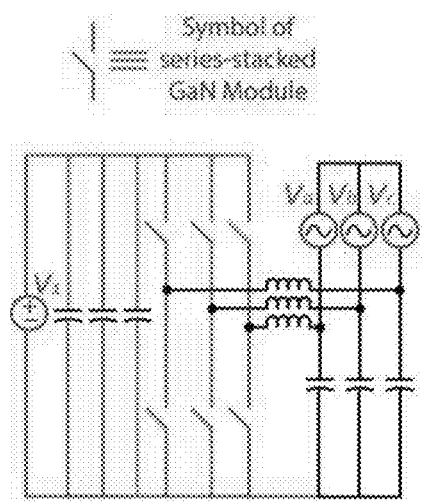
FIG. 15(b) shows a circuit of a three-phase buck DC-AC inverter according to an embodiment of the subject invention.

FIGS. 15(*a*) and 15(*b*) show a connection diagram and a circuit of a three-phase buck DC-AC inverter according to an embodiment of the subject invention, respectively. Referring to FIGS. 15(*a*) and 15(*b*), a three-phase buck DC-AC inverter 810 comprises the first PEBB 100_1, the second PEBB 100_2, and a third PEBB 100_3 that are identical to the PEBB 100 of FIG. 6. That is, the third PEBB 100_3 of the three-phase buck DC-AC inverter 810 further comprises a third upper series-stacked HEMT module 205 (e.g., upper series-stacked GaN module) and a third lower series-stacked HEMT module 405 that are connected to each other in series through a third intermediate terminal 117 between a ninth power terminal 109 and a tenth power terminal 110. That is, the third upper series-stacked HEMT module 205 is connected between the ninth power terminal 109 and the third intermediate terminal 117, and the third lower series-stacked HEMT module 405 is connected between the third intermediate terminal 117 and the tenth power terminal 110.

The third PEBB 100_3 further comprises a third inductor 134 between the third intermediate terminal 117 and a eleventh power terminal 111. In addition, the third PEBB 100_3 comprises a fifth capacitor 124 connected between the ninth power terminal 109 and the tenth power terminal 110, and a sixth capacitor 144 connected between the eleventh power terminal 111 and a twelfth power terminal 112, where the twelfth power terminal 112 is connected to the tenth power terminal 110 and the third lower series-stacked HEMT module 405. Each of the third upper 205 and third lower 405 series-stacked HEMT modules comprises a third plurality of HEMTs 355 and a third SSD 305, where each gate of the third plurality of HEMTs 355 is connected to the third SSD 305. Each of the third plurality of HEMTs 355 is made of GaN HEMT.

The three-phase buck DC-AC inverter 810 comprises the first power source 510 connected between the first power terminal 101 and the second power terminal 102, a first phase power source 530 connected to the third power terminal 103, a second phase power source 540 connected to the seventh power terminal 107, and a third phase power source 550 connected to the eleventh power terminal 111. In addition, the second power terminal 102, the sixth power terminal 106, and the tenth power terminal 110 are connected to each other, and the fourth power terminal 104, the eighth power terminal 108, and the twelfth power terminal 112 are connected to each other.

Figure 16A:
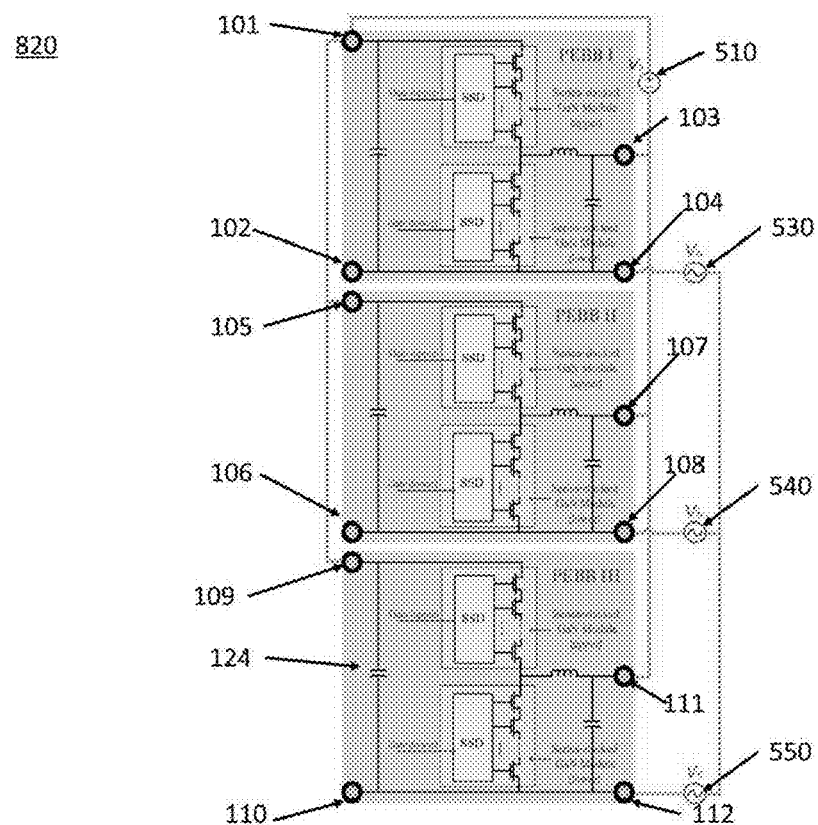
FIG. 16(a) shows a connection diagram of a three-phase buck-boost DC-AC inverter according to an embodiment of the subject invention.
Figure 16B:
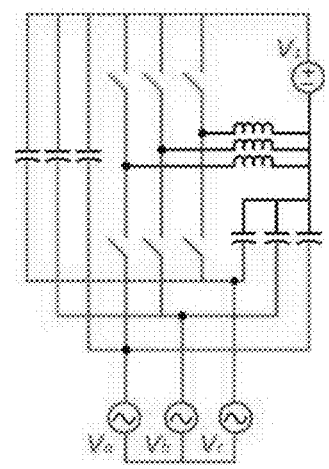
FIG. 16(b) shows a circuit of a three-phase buck-boost DC-AC inverter according to an embodiment of the subject invention.

FIGS. 16(*a*) and 16(*b*) show a connection diagram and a circuit of a three-phase buck-boost DC-AC inverter according to an embodiment of the subject invention, respectively. Referring to FIGS. 16(*a*) and 16(*b*), a three-phase buck-boost DC-AC inverter 820 comprises the first power source 510 connected between the first power terminal 101 and the third power terminal 103, the first phase power source 530 connected to the fourth power terminal 104, the second phase power source 540 connected to the eighth power terminal 108, and the third phase power source 550 connected to the twelfth power terminal 112. In addition, the fifth power terminal 105 and the ninth power terminal 109 are connected to the first power terminal 101, and the third power terminal 103, the seventh power terminal 107, and the eleventh power terminal 111 are connected to each other.

Embodiments of the subject invention can be used in spare parts for power electronic systems in marine and aerospace power systems, electrified transportation systems, fast charging stations, and renewable energy systems. Embodiments of the subject invention make power conversion more efficient, and require simpler control schemes than conventional multi-level systems. In addition, the PEBBs according to embodiments of the subject invention require less cooling system compared to Si or SiC PEBBs. Moreover, embodiments can extend the operating voltage of PEBBs beyond 1.3 kV. Embodiments will reduce the mass production cost of power electronic systems built with GaN transistors and reduce the breakdown voltage of the GaN HEMTs.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A power converter, comprising:
a first power terminal and a second power terminal;

a first upper series-stacked high electron mobility transistor (HEMT) module connected to the first power terminal and a first intermediate terminal;
a first lower series-stacked HEMT module connected to the second power terminal and the first intermediate terminal;
a first inductor connected to the first intermediate terminal and a third power terminal; and
a fourth power terminal connected to the second power terminal;
a fifth power terminal and a sixth power terminal;
a second upper series-stacked HEMT module connected to the fifth power terminal and a second intermediate terminal;
a second lower series-stacked HEMT module connected to the sixth power terminal and the second intermediate terminal;
a second inductor connected to the second intermediate terminal and a seventh power terminal; and
an eighth power terminal connected to the sixth power terminal,
each of the first upper series-stacked HEMT module and the first lower series-stacked HEMT module comprising a first plurality of HEMTs and a first series-switch-driver connected to each gate of the first plurality of HEMTs, and
each of the second upper series-stacked HEMT module and the second lower series-stacked HEMT module comprising a second plurality of HEMTs and a second series-switch-driver connected to each gate of the second plurality of HEMTs.

2. The power converter according to claim 1, further comprising a first power source connected between the third power terminal and the fourth power terminal, and a second power source connected between the first power terminal and the second power terminal.

3. The power converter according to claim 1, further comprising a first power source connected between the first power terminal and the third power terminal, and a second power source connected between the third power terminal and the fourth power terminal.

4. The power converter according to claim 1, further comprising:
a first power source connected between the first power terminal and the second power terminal; and
a second power source connected between the fifth power terminal and the sixth power terminal,
the third power terminal being connected to the seventh power terminal, and
the fourth power terminal being connected to the eighth power terminal.

5. The power converter according to claim 1, further comprising:
a first power source connected between the first power terminal and the sixth power terminal; and
a second power source connected between the third power terminal and the seventh power terminal,
the second power terminal being connected to the sixth power terminal,
the first power terminal being connected to the fifth power terminal, and
the fourth power terminal being connected to the eighth power terminal.

6. The power converter according to claim 1, further comprising:
a first power source connected between the third power terminal and the fourth power terminal; and
a second power source between the first power terminal and the fifth power terminal,
the second power terminal being connected to the sixth power terminal,
the third power terminal being connected to the seventh power terminal, and
the fourth power terminal being connected to the eighth power terminal.

7. The power converter according to claim 1, further comprising:
a first power source connected between the first power terminal and the seventh power terminal; and
a second power source between the fourth power terminal and the eighth power terminal,
the first power terminal being connected to the fifth power terminal, and
the third power terminal being connected to the seventh power terminal.

8. The power converter according to claim 1, further comprising:
a ninth power terminal and a tenth power terminal;
a third upper series-stacked HEMT module connected to the ninth power terminal and a third intermediate terminal;
a third lower series-stacked HEMT module connected to the tenth power terminal and the third intermediate terminal;
a third inductor connected to the third intermediate terminal and a eleventh power terminal; and
a twelfth power terminal connected to the tenth power terminal,
each of the third upper series-stacked HEMT module and the third lower series-stacked HEMT module comprising a third plurality of HEMTs and a third series-switch-driver connected to each gate of the third plurality of HEMTs.

9. The power converter according to claim 8, further comprising:
a first power source connected between the first power terminal and the second power terminal;
a first phase power source connected to the third power terminal;
a second phase power source connected to the seventh power terminal; and
a third phase power source connected to the eleventh power terminal,
the second power terminal, the sixth power terminal, and the tenth power terminal being connected to each other, and
the fourth power terminal, the eighth power terminal, and the twelfth power terminal being connected to each other.

10. The power converter according to claim 8, further comprising:
a first power source connected between the first power terminal and the third power terminal;
a first phase power source connected to the fourth power terminal;
a second phase power source connected to the eighth power terminal; and
a third phase power source connected to the twelfth power terminal,
the fifth power terminal and the ninth power terminal being connected to the first power terminal, and
the third power terminal, the seventh power terminal, and the eleventh power terminal being connected to each other.

11. A power converter, comprising:
a first power terminal and a second power terminal;
a first upper series-stacked high electron mobility transistor (HEMT) module connected to the first power terminal and a first intermediate terminal;
a first lower series-stacked HEMT module connected to the second power terminal and the first intermediate terminal;
a first inductor connected to the first intermediate terminal and a third power terminal; and
a fourth power terminal connected to the second power terminal,
each of the first upper series-stacked HEMT module and the first lower series-stacked HEMT module comprising a first plurality of HEMTs and a first series-switch-driver connected to each gate of the first plurality of HEMTs,
each of the first upper series-stacked HEMT module and the first lower series-stacked HEMT module comprising:
a first HEMT;
a second HEMT, a first drain of the first HEMT being connected to a second source of the second HEMT;
a first gate input terminal coupled to a first gate of the first HEMT;
a second gate input terminal coupled to a second gate of the second HEMT;
a first driver connected between the first gate input terminal and a first gate intermediate terminal;
a first FB connected between the first gate intermediate terminal and the first gate of the first HEMT;
a second driver connected between the second gate input terminal and a second gate intermediate terminal;
a first gate capacitor connected between the first gate input terminal and the second gate input terminal; and
a second gate capacitor connected between the second gate intermediate terminal and a second drain of the second HEMT, and
the second driver comprising a second FB connected between the second gate input terminal and a second gate intermediate terminal.

12. The power converter according to claim 11, each of the first and second driver comprising two diodes.

13. The power converter according to claim 11, further comprising:
a first Zener diode connected between the first gate intermediate terminal and a first source of the first HEMT; and
a second Zener diode connected between the second gate intermediate terminal and the second source of the second HEMT.

14. The power converter according to claim 11, each of the first HEMT and the second HEMT being a gallium nitride (GaN) HEMT.

15. A power converter, comprising:
a first power terminal and a second power terminal;
a first upper series-stacked high electron mobility transistor (HEMT) module connected to the first power terminal and a first intermediate terminal;
a first lower series-stacked HEMT module connected to the second power terminal and the first intermediate terminal;
a first inductor connected to the first intermediate terminal and a third power terminal; and
a fourth power terminal connected to the second power terminal,
each of the first upper series-stacked HEMT module and the first lower series-stacked HEMT module comprising a first plurality of HEMTs and a first series-switch-driver connected to each gate of the first plurality of HEMTs, and
each of the first upper series-stacked HEMT module and the first lower series-stacked HEMT module comprising:
first to nth HEMTs being connected in series to each other;
first to nth gate input terminals coupled to first to nth gates of first to nth gate HEMTs through first to nth gate intermediate terminal, respectively;
first to nth drivers connected between the first to nth gate input terminals and the first to nth gate intermediate terminal;
a first gate capacitor connected between the first gate input terminal and the second gate input terminal;
a kth gate capacitor connected between a (k+1)th gate input terminal and a kth source, k being from 2 to (n−1);
a nth gate capacitor connected between a nth gate intermediate terminal and a nth drain.

16. The power converter according to claim 15, further comprising first to nth Zener diodes, each of the first to nth Zener diode being connected between each of the first to nth gate intermediate terminal and each source of the first to nth HEMTs.

17. The power converter according to claim 15, further comprising first to nth FBs,
each of the first to (n−1)th FBs being connected between each of the first to (n−1)th gate intermediate terminal and each gate of the first to (n−1)th HEMTs, and
the nth FB being connected between nth gate input terminal and the nth gate intermediate terminal.

18. A power converter, comprising:
a first power terminal and a second power terminal;
a first upper series-stacked high electron mobility transistor (HEMT) module connected to the first power terminal and a first intermediate terminal;
a first lower series-stacked HEMT module connected to the second power terminal and the first intermediate terminal;
a first inductor connected to the first intermediate terminal and a third power terminal;
a fourth power terminal connected to the second power terminal;
a fifth power terminal and a sixth power terminal;
a second upper series-stacked HEMT module connected to the fifth power terminal and a second intermediate terminal;
a second lower series-stacked HEMT module connected to the sixth power terminal and the second intermediate terminal;
a second inductor connected to the second intermediate terminal and a seventh power terminal; and
an eighth power terminal connected to the sixth power terminal,
each of the first upper series-stacked HEMT module and the first lower series-stacked HEMT module comprising a first plurality of HEMTs and a first series-switch-driver connected to each gate of the first plurality of HEMTs,
each of the second upper series-stacked HEMT module and the second lower series-stacked HEMT module comprising a second plurality of HEMTs and a second series-switch-driver connected to each gate of the second plurality of HEMTs, each of the first upper series-stacked HEMT module, the first lower series-stacked HEMT module, the second upper series-stacked HEMT module, and the second lower series-stacked HEMT module comprising:
a first HEMT;
a second HEMT, a first drain of the first HEMT being connected to a second source of the second HEMT;
a first gate input terminal coupled to a first gate of the first HEMT;
a second gate input terminal coupled to a second gate of the second HEMT;
a first driver connected between the first gate input terminal and a first gate intermediate terminal;
a first FB connected between the first gate intermediate terminal and the first gate of the first HEMT;
a second driver connected between the second gate input terminal and a second gate intermediate terminal;
a first gate capacitor connected between the first gate input terminal and the second gate input terminal; and
a second gate capacitor connected between the second gate intermediate terminal and a second drain of the second HEMT, and the second driver comprising a second FB connected between the second gate input terminal and a second gate intermediate terminal.

* * * * *